(12) United States Patent
Miller et al.

(10) Patent No.: US 11,264,749 B2
(45) Date of Patent: Mar. 1, 2022

(54) MODULAR CONNECTOR WITH PRINTED CIRCUIT BOARD WAFER TO REDUCE CROSSTALK

(71) Applicant: TE Connectivity Services GmbH, Schaffhausen (CH)

(72) Inventors: Keith Edwin Miller, Manheim, PA (US); Albert Tsang, Harrisburg, PA (US); Scott Eric Walton, Mount Joy, PA (US); Eric Douglas Springston, II, Hershey, PA (US); Andrew M. Martin, Glendale, CA (US)

(73) Assignee: TE CONNECTIVITY SERVICES GmbH, Schaffhausen (CH)

( * ) Notice: Subject to any disclaimer, the term of this patent is extended or adjusted under 35 U.S.C. 154(b) by 0 days.

(21) Appl. No.: 16/830,581

(22) Filed: Mar. 26, 2020

(65) Prior Publication Data
US 2021/0305737 A1   Sep. 30, 2021

(51) Int. Cl.
| | |
|---|---|
| H01R 12/72 | (2011.01) |
| H01R 12/73 | (2011.01) |
| H01R 13/6587 | (2011.01) |
| H01R 13/6586 | (2011.01) |
| H01R 13/6476 | (2011.01) |
| H01R 13/6473 | (2011.01) |

(52) U.S. Cl.
CPC ......... *H01R 12/727* (2013.01); *H01R 12/724* (2013.01); *H01R 12/73* (2013.01); *H01R 13/6587* (2013.01); *H01R 13/6473* (2013.01); *H01R 13/6476* (2013.01); *H01R 13/6586* (2013.01)

(58) Field of Classification Search
CPC .. H01R 12/727; H01R 13/6587; H01R 12/73; H01R 12/724; H01R 13/6586; H01R 13/6476; H01R 13/6473
USPC ............. 439/607.01, 607.23, 607.09–607.12
See application file for complete search history.

(56) References Cited

U.S. PATENT DOCUMENTS

| | | | |
|---|---|---|---|
| 6,171,115 B1 | 1/2001 | Mickievicz et al. |
| 6,267,604 B1 | 7/2001 | Mickievicz et al. |
| 6,384,341 B1 | 5/2002 | Rothermel et al. |
| 6,488,549 B1 | 12/2002 | Weller et al. |

(Continued)

OTHER PUBLICATIONS

European Search Report, dated Aug. 31, 2021, EP 21 16 3861, European Application No. 21163861.4-1201.

*Primary Examiner* — Abdullah A Riyami
*Assistant Examiner* — Justin M Kratt

(57) ABSTRACT

A circuit board for use in a modular electrical connector. The circuit board has a first surface and an oppositely facing second surface. Signal pathways are provided on the first surface. The signal pathways have signal pathway ends abutting a mounting end of the circuit board. First ground pathways are provided on the first surface. The first ground pathways are positioned adjacent at least one of the signal pathways. The first ground pathways have first ground pathway ends abutting the mounting end of the circuit board. One or more second ground pathways are provided on the second surface. The one or more second ground pathways have second ground pathway ends abutting the mounting end of the circuit board. The positioning of the signal pathway ends, the first ground pathway ends and the second ground pathway ends abutting the mounting end reduces crosstalk between signal pairs.

12 Claims, 6 Drawing Sheets

(56) References Cited

U.S. PATENT DOCUMENTS

| | | | |
|---|---|---|---|
| 6,540,522 B2 * | 4/2003 | Sipe | H01R 13/6658 |
| | | | 439/61 |
| 6,582,250 B2 | 6/2003 | Taylor et al. | |
| 6,655,966 B2 | 12/2003 | Rothermel et al. | |
| 6,663,426 B2 | 12/2003 | Hasircoglu et al. | |
| 6,663,442 B1 | 12/2003 | Helster et al. | |
| 6,676,450 B2 | 1/2004 | Schroll | |
| 6,705,895 B2 | 3/2004 | Hasircoglu | |
| 6,808,399 B2 | 10/2004 | Rothermel et al. | |
| 6,811,414 B1 | 11/2004 | Consoli et al. | |
| 6,811,440 B1 | 11/2004 | Rothermel et al. | |
| 6,824,391 B2 | 11/2004 | Mickievicz et al. | |
| 6,875,031 B1 | 4/2005 | Korsunsky et al. | |
| 6,884,117 B2 * | 4/2005 | Korsunsky | H01R 13/6585 |
| | | | 439/607.11 |
| 6,890,214 B2 | 5/2005 | Brown et al. | |
| 6,932,649 B1 | 8/2005 | Rothermel et al. | |
| 6,945,810 B1 | 9/2005 | Morana et al. | |
| 6,964,583 B2 | 11/2005 | D'Ambrosia et al. | |
| 6,997,736 B2 | 2/2006 | Costello et al. | |
| 7,044,794 B2 | 5/2006 | Consoli et al. | |
| 7,175,445 B2 | 2/2007 | Consoli et al. | |
| 8,840,431 B2 | 9/2014 | Nguyen et al. | |
| 10,535,971 B2 | 1/2020 | Annis et al. | |
| 2017/0358881 A1 | 12/2017 | Smith, Jr. | |

* cited by examiner

MODULAR CONNECTOR WITH PRINTED CIRCUIT BOARD WAFER TO REDUCE CROSSTALK

FIELD OF THE INVENTION

The present invention relates to a modular connector with reduced crosstalk. In particular, the invention relates to a modular connector with one or more printed circuit board wafers with enhanced shielding to reduce crosstalk.

BACKGROUND OF THE INVENTION

Due to the increasing complexity of electronic components, it is desirable to fit more components in less space on a circuit board or other substrate. Consequently, the spacing between electrical terminals within connectors has been reduced, while the number of electrical terminals housed in the connectors has increased, thereby increasing the need in the electrical arts for electrical connectors that are capable of handling higher and higher speeds and to do so with greater and greater pin densities. It is desirable for such connectors to have not only reasonably constant impedance levels, but also acceptable levels of impedance and cross-talk, as well as other acceptable electrical and mechanical characteristics. Therefore, there remains a need to provide appropriate shielding to preserve signal integrity and to minimize cross-talk as speeds of signals increase and the footprint of the connector remains the same or decreases.

It would, therefore, be beneficial to provide a connector which reduces crosstalk between signal contact pairs. It would also be beneficial to provide a printed circuit board wafer which increases or maximizes the grounding plane, thereby minimizing the crosstalk between signal contact pairs.

SUMMARY OF THE INVENTION

An embodiment is directed to a circuit board for use in a modular electrical connector. The circuit board has a first surface and an oppositely facing second surface. Signal pathways are provided on the first surface. The signal pathways have signal pathway ends abutting a mounting end of the circuit board. First ground pathways are provided on the first surface. The first ground pathways are positioned adjacent at least one of the signal pathways. The first ground pathways have first ground pathway ends abutting the mounting end of the circuit board. One or more second ground pathways are provided on the second surface. The one or more second ground pathways have second ground pathway ends abutting the mounting end of the circuit board. The positioning of the signal pathway ends abutting the mounting end, the positioning of the first ground pathway ends abutting the mounting end and the positioning of the second ground pathway ends abutting the mounting end minimizes or reduces crosstalk between signal pairs.

An embodiment is directed to a modular electrical connector with a housing having modules positioned therein. The modules have circuit boards. The circuit boards include first surfaces and oppositely facing second surfaces. Signal pathways are provided on the first surfaces. The signal pathways have signal pathway ends abutting mounting ends of the circuit boards. First ground pathways are provided on the first surfaces. Each of the first ground pathways are positioned adjacent at least one of the signal pathways. The first ground pathways have first ground pathway ends abutting the mounting ends of the circuit boards. One or more second ground pathways are provided on the second surfaces. The one or more second ground pathways have second ground pathway ends abutting the mounting ends of the circuit boards. Signal mounting contacts and ground mating contacts are provided at the mating ends of the circuit boards. The positioning of the signal pathway ends abutting the mounting ends, the positioning of the first ground pathway ends abutting the mounting ends and the positioning of the second ground pathway ends abutting the mounting ends reduces crosstalk between differential signal pairs of the signal pathways.

Other features and advantages of the present invention will be apparent from the following more detailed description of the illustrative embodiment, taken in conjunction with the accompanying drawings which illustrate, by way of example, the principles of the invention.

DETAILED DESCRIPTION OF THE INVENTION

Figure 1:
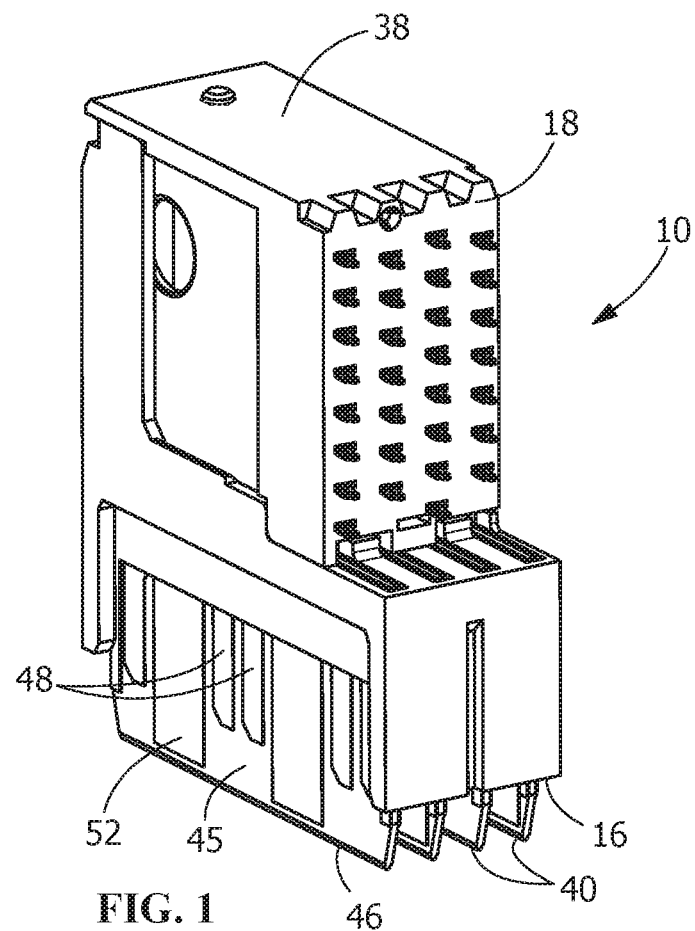
FIG. 1 is a perspective view of an illustrative connector of the present invention, the connector having a plurality of printed circuit board wafers extending therethrough.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached,"

"affixed," "connected," "coupled," "interconnected," and similar refer to a relationship wherein structures are secured or attached to one another either directly or indirectly through intervening structures, as well as both movable or rigid attachments or relationships, unless expressly described otherwise.

Moreover, the features and benefits of the invention are illustrated by reference to the preferred embodiments. Accordingly, the invention expressly should not be limited to such embodiments illustrating some possible non-limiting combination of features that may exist alone or in other combinations of features, the scope of the invention being defined by the claims appended hereto.

FIG. 1 illustrates an electrical connector 10 formed in accordance with an illustrative embodiment. In the illustrative embodiment, the electrical connector 10 is a daughtercard connector that can be mated to a mating backplane connector (not shown) to electrically connect a backplane circuit board (not shown) and a daughtercard circuit board (not shown). While the electrical connector 10 is described herein with reference to a daughtercard connector, it is realized that the subject matter herein may be utilized with different types of electrical connectors other than a daughtercard connector. The daughtercard connector 10 is merely illustrative of an illustrative embodiment of the type of electrical connector 10 that mates with a mating connector.

In the illustrative embodiment shown, the connector 10 constitutes a right angle connector wherein a mating end 16 and mounting end 18 of the connector 10 are oriented perpendicular to one another. The connector 10 is mounted to the daughtercard circuit board (not shown) at the mounting end 18. The connector 10 is mounted to the mating connector (not shown) at the mating end 16. Other orientations of the ends 16, 18 are possible in alternative embodiments.

As shown in the illustrative embodiment shown in FIGS. 2 through 5, the connector 10 includes a housing 38 which is made from a plurality of modules 40. Each of the modules 40 has a circuit board or substrate 45.

Figure 2:
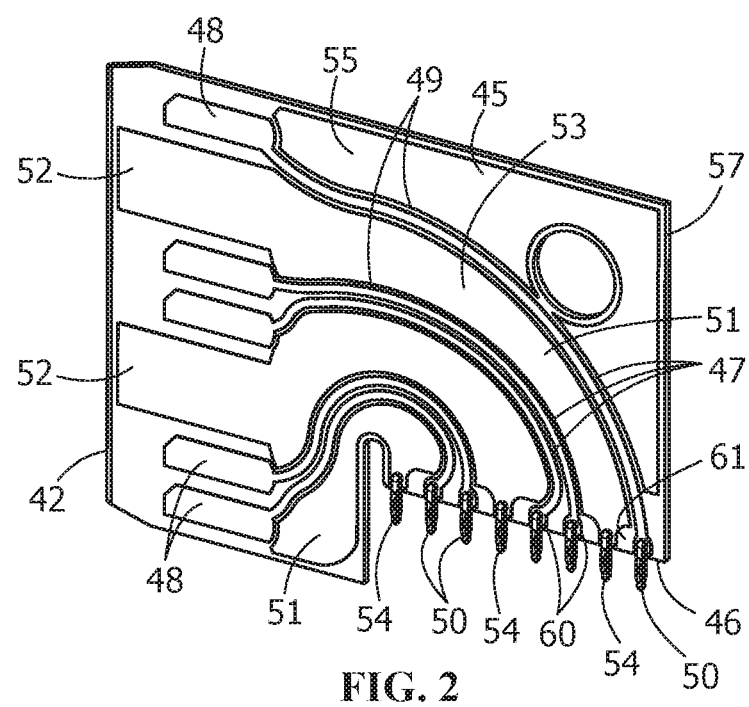
FIG. 2 is a front perspective view of an illustrative printed circuit board wafer of the connector shown in FIG. 1.

As shown in FIG. 2, each of the substrate 45 has a mating end 24 configured to mate with the mating connector (not shown) and a mounting end 46 which is configured to mount to the daughtercard circuit board (not shown). The substrates 45 hold a plurality of individual signal pathways 47 which include mating signal contact pads 48, signal traces 49 and mounting signal contacts 50. The mating signal contact pads 48 are mechanically and electrically connected to the signal traces 49 by known methods. The mounting signal contacts 50 are mechanically and electrically connected to the signal traces 49 by known methods, such as but not limited to soldering, as will be more fully described. The signal pathways 47 extend from proximate the mating end 42 to the mounting end 46. Ends 60 of the signal traces 49 are positioned in line or abut the mounting end 46 of the substrate 45. In an exemplary embodiment, the signal pathways 47 are arranged in pairs carrying differential signals. The individual signal pathways 47 are positioned on a first surface 55 of the circuit boards 45.

Each of the substrates 45 of the modules 40 holds a plurality of first ground pathways 51 which include mating ground contact pads 52, ground traces 53 and mounting ground contacts 54. The mounting ground contacts 54 are mechanically and electrically connected to the ground traces 53 by known methods, such as but not limited to soldering to a conductive pad of the ground traces 53. The ground pathways 51 extend from proximate the mating end 42 to the mounting end 46. Ends 61 of the ground traces 53 are positioned in line or abut the mounting end 46 of the substrate 45. The individual ground pathways 51 are positioned on the first surface 55 of each module 40.

Figure 3:
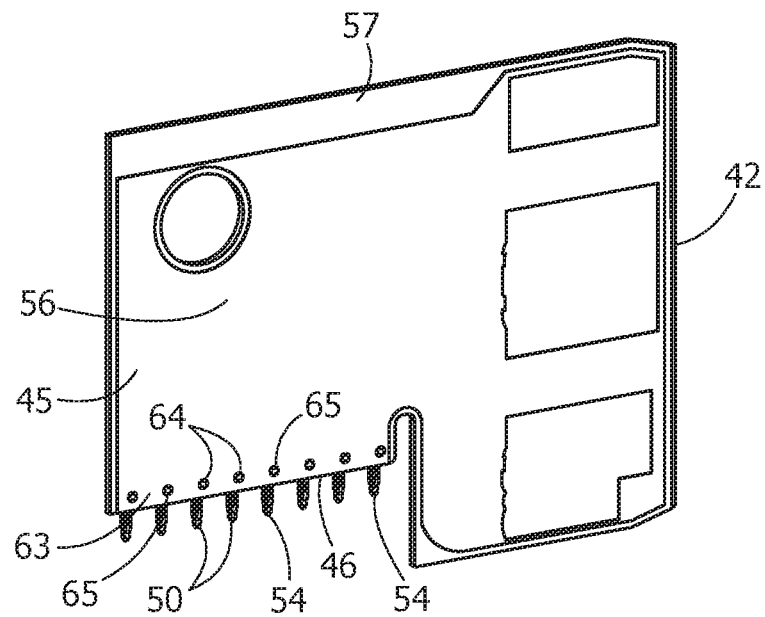
FIG. 3 is a back perspective view of the printed circuit board wafer of FIG. 2.
Figure 4:
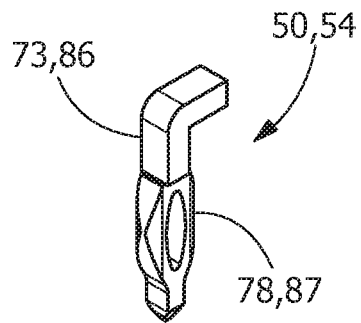
FIG. 4 is a perspective view of an illustrative mounting contact of the printed circuit board wafer of FIG. 1.
Figure 5:
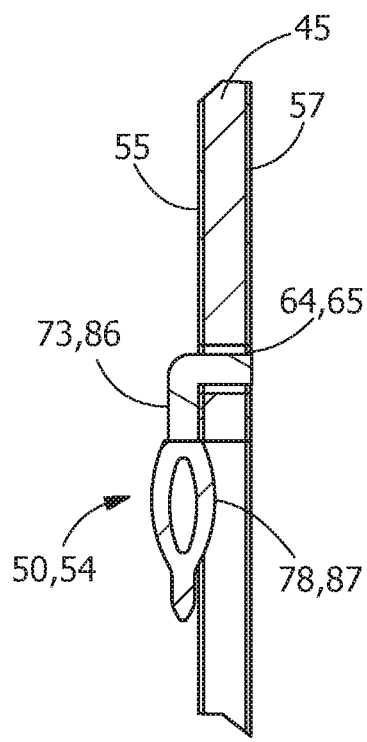
FIG. 5 is a cross-section view of the mounting contact of FIG. 4 mounted in the printed circuit board of FIG. 2.
Figure 6:
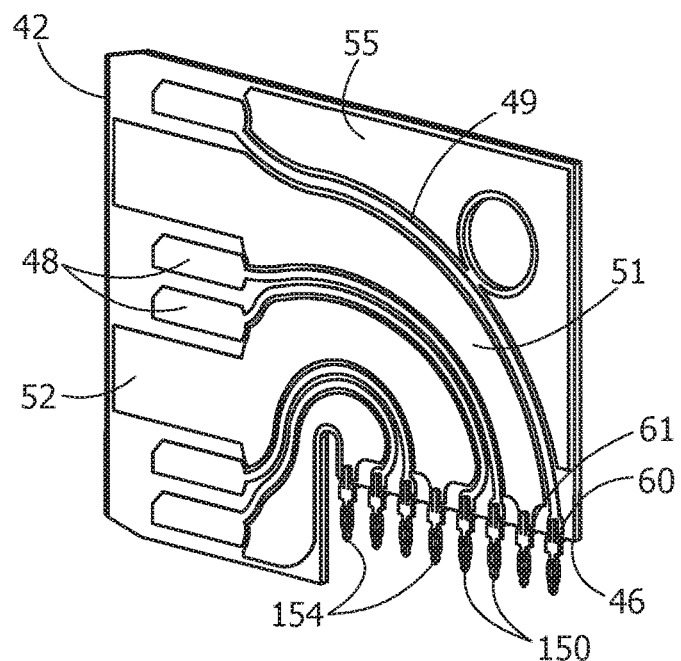
FIG. 6 is a front perspective view of an alternate illustrative printed circuit board wafer.
Figure 7:
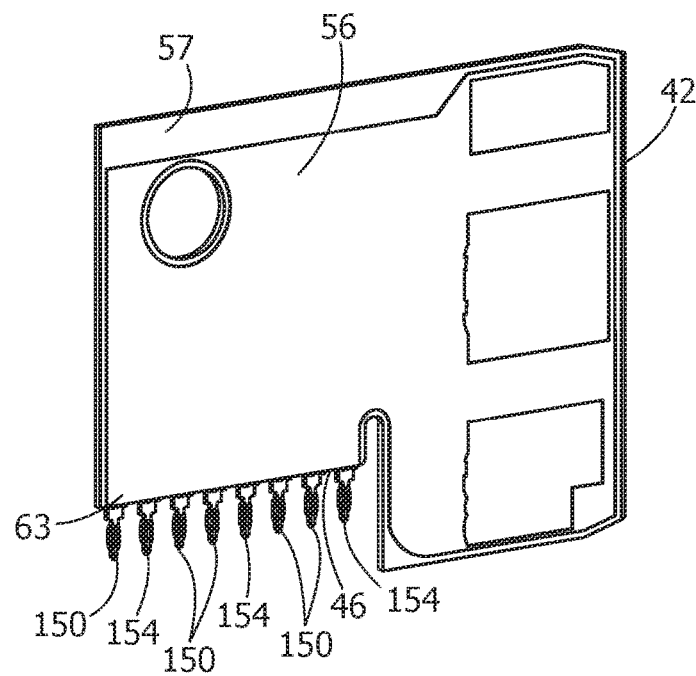
FIG. 7 is a back perspective view of the printed circuit board wafer of FIG. 6.
Figure 8:
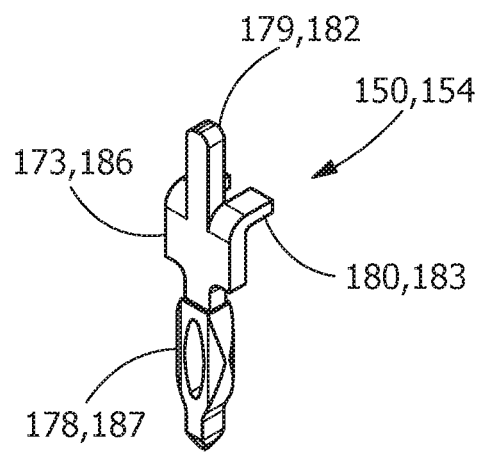
FIG. 8 is a perspective view of an illustrative mounting contact of the printed circuit board wafer of FIG. 6.
Figure 9:
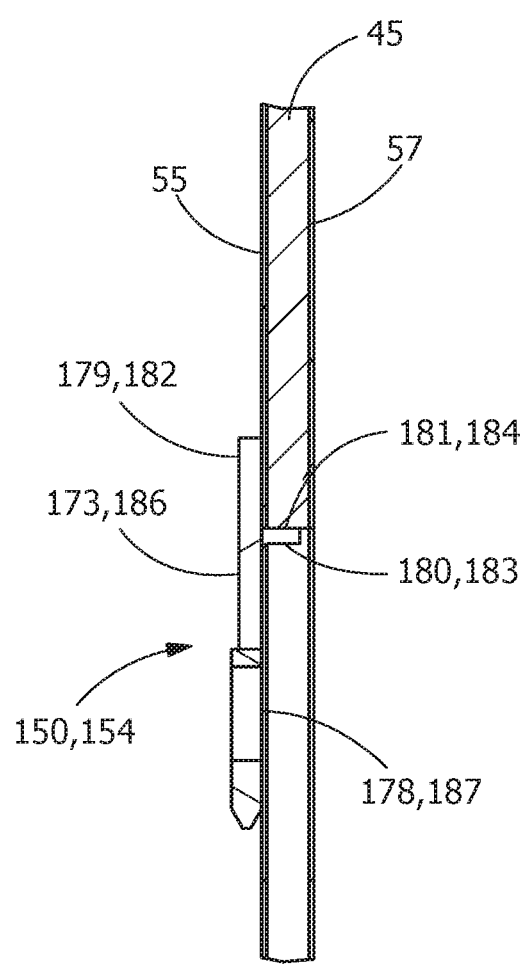
FIG. 9 is a cross-section view of the mounting contact of FIG. 8 mounted in the printed circuit board of FIG. 6.
Figure 10:
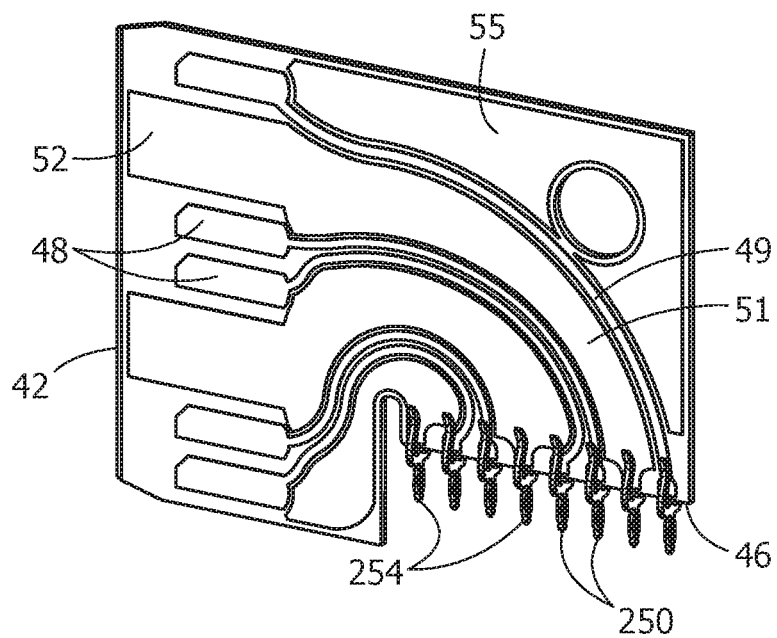
FIG. 10 is a front perspective view of another alternate illustrative printed circuit board wafer.
Figure 11:
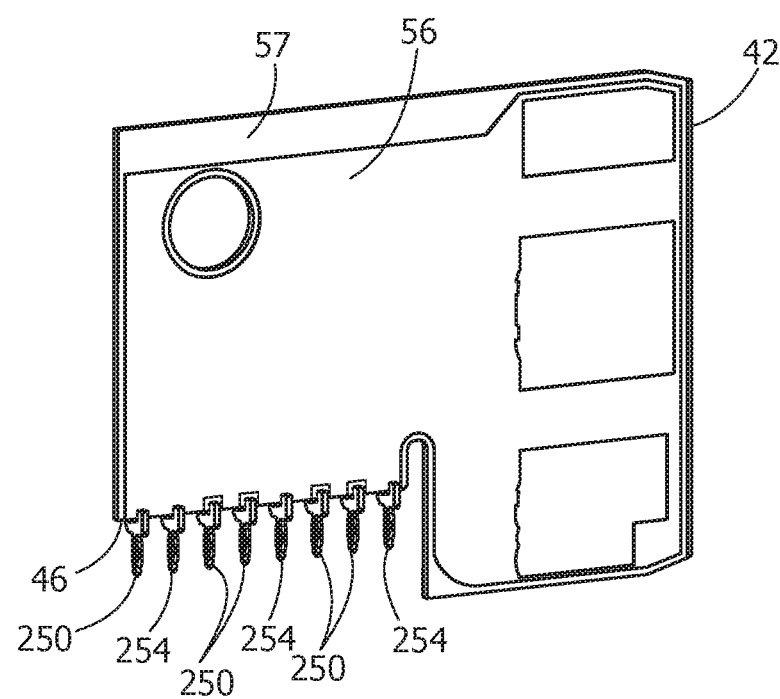
FIG. 11 is a back perspective view of the printed circuit board wafer of FIG. 10.
Figure 12:
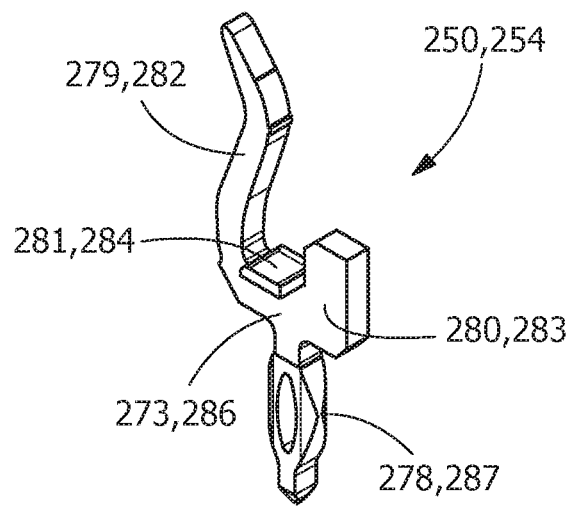
FIG. 12 is a perspective view of an illustrative mounting contact of the printed circuit board wafer of FIG. 10.
Figure 13:
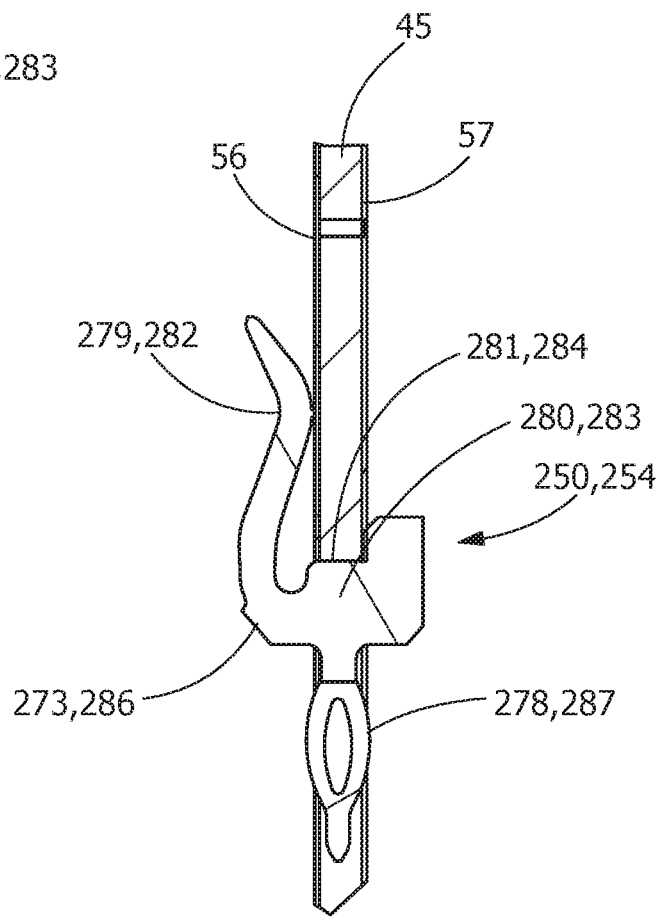
FIG. 13 is a cross-section view of the mounting contact of FIG. 12 mounted in the printed circuit board of FIG. 10.

As shown in FIG. 3, each of the substrates 45 of the modules 40 include second ground pathways or traces 56 on a second surface 57 of each substrate 45. The second surface 57 being opposed and spaced from the first surface 55. The ground traces 56 extend from proximate the mating end 42 to the mounting end 46. Ends 63 of the ground traces 56 are positioned in line or abut the mounting end 46 of the substrate 45.

First openings 64 are provided proximate the mounting end 46 of the substrate 45. The openings 64 are positioned in the signal traces 49 and extend from the first surface 55 to the second surface 57. In the illustrative embodiment shown, the openings 64 are provided in electrical engagement with the signal traces 49, but are not provided in electrical engagement with the ground traces 56 on the second surface 57.

Second openings 65 are provided proximate the mounting end 46 of the substrate 45. The openings 65 are positioned in the ground traces 53 and extend from the first surface 55 to the second surface 57. In the illustrative embodiment shown, the openings 65 are provided in electrical engagement with the ground traces 53 and the ground traces 56 on the second surface 57.

The mounting signal contacts 50 have mounting members 73 and compliant portions 78. The mounting members 73 are configured to be positioned in the openings 64 through the first surfaces 55 of the substrates 45. The mounting members 73 of the mounting signal contacts 50 are mechanically and electrically mounted in the openings 64 and connected to the signal traces 49 by known methods, such as but not limited to soldering, The compliant portions 78 are configured to engage the daughtercard (not shown). The compliant portions 78 may be, but are not limited to, an eye of the needle pin, although other configurations may be used.

The mounting ground contacts 54 have mounting members 86 and compliant portions 87. The mounting members 86 are configured to be positioned in the openings 65 through the first surfaces 55 of the substrates 45. The mounting members 86 of the mounting ground contacts 54 are mechanically and electrically mounted in the openings 65 and connected to the ground traces 53 and the ground traces 56 by known methods, such as but not limited to soldering, The compliant portions 87 are configured to engage the daughtercard (not shown). The compliant portions 87 may be, but are not limited to, an eye of the needle pin, although other configurations may be used.

The combination of the ground pathways 51 and the ground traces 56 surround the pairs of signal pathways 47. As the ground pathways 51 and the ground traces 56 are electrically commoned together, the ground pathways 51 and the ground traces 56 provide electrical shielding and reduce crosstalk between the pairs of signal pathways 47.

In the illustrative embodiment shown in FIG. 1, the housing 38 of the connector 10 has four modules 40 which are positioned adjacent to each other. However, other numbers of modules may be used. Each module 40 is spaced from adjacent modules 40 to provide mating slots 62 for receiving portions of the mating connector.

With the housing 38 properly assembled, the ground pathways 51 and the ground traces 56 of adjacent modules 40 extend about the periphery of the pairs of signal pathways 47 and surround the pairs of signal pathways 47 to provide electrical shielding for the pairs of signal pathways 47. In an exemplary embodiment, entire, 360 degree shielding is provided by the ground pathways 51 and the ground traces 56 along the length of the signal pathways 47. The ground pathways 51 and the ground traces 56 may control electrical characteristics at the mating ends and throughout the housing 38, such as by controlling cross talk, signal radiation or other electrical characteristics.

As the ends 60 of the signal traces 49, the ends 61 of the ground traces 53 and the ends 63 of the ground traces 56 are positioned in line or abut the mounting end 46 of the substrate 45 the amount of ground that is present on the substrates 45 and the connector 10 is maximized, which in turn minimized crosstalk between signal pairs. In addition, as the openings 64 and openings 65 are positioned proximate to the mounting end 46, the length of the mounting members 73 of the mounting signal contacts 50 and the length of the mounting members 86 of the mounting ground contacts 54 is minimized, which also reduces the crosstalk between signal pairs.

As shown in a first alternate illustrative embodiment illustrated in FIGS. 6 through 9, the mounting signal contacts 150 have mounting members 173 and compliant portions 178. The mounting members 173 have signal trace engaging members 179 and support members 180. The signal trace engaging members 179 are mechanically and electrically mounted and connected to the ends of the signal traces 49 by known methods, such as but not limited to soldering. The support members 180 extend at approximately right angles to the signal trace engaging members 179. The support members 180 have support surfaces 181 which cooperate with the mounting end 46 of the substrate 45 to properly locate the mounting signal contacts 150 and to provide support to the substrate 45 and the mounting signal contacts 150. The compliant portions 178 are configured to engage the daughtercard (not shown). The compliant portions 178 may be, but are not limited to, an eye of the needle pin, although other configurations may be used.

The mounting ground contacts 154 have mounting members 186 and compliant portions 187. The mounting members 186 have ground trace engaging members 182 and support members 183. The ground trace engaging members 182 are mechanically and electrically mounted and connected to the ends of the ground traces 56 by known methods, such as but not limited to soldering. The support members 183 extend at approximately right angles to the ground trace engaging members 182. The support members 183 have support surfaces 184 which cooperate with the mounting end 46 of the substrate 45 to properly locate the mounting ground contacts 154 and to provide support to the substrate 45 and the mounting ground contacts 154. The compliant portions 187 are configured to engage the daughtercard (not shown). The compliant portions 187 may be, but are not limited to, an eye of the needle pin, although other configurations may be used.

As shown in a second alternate illustrative embodiment illustrated in FIGS. 10 through 13, the mounting signal contacts 250 have mounting members 273 and compliant portions 278. The mounting members 273 have signal trace engaging members 279 and support members 280. The support members 280 have support surfaces 281 which cooperate with the mounting end 46 of the substrate 45 to properly locate the mounting signal contacts 250 and to provide support to the substrate 45 and the mounting signal contacts 250. The support surfaces 281 are electrically insulated from the ground surfaces of the substrate 45. Examples of how to provide the insulation include, but are not limited to, removing the ground surface of the substrate 45 or adding an insulative surface over the ground surface of the substrate 45. The signal trace engaging members 279 extend from the support members 280 and are mechanically and electrically mounted and connected to the ends of the signal traces 49 by known methods, such as, but not limited to, by pressure applied by the compliant beam of the signal trace engaging member 279 or by soldering. The compliant portions 278 are configured to engage the daughtercard (not shown). The compliant portions 278 may be, but are not limited to, an eye of the needle pin, although other configurations may be used.

The mounting ground contacts 254 have mounting members 286 and compliant portions 287. The mounting members 286 have ground trace engaging members 282 and support members 283. The support members 283 have support surfaces 284 which cooperate with the mounting end 46 of the substrate 45 to properly locate the mounting ground contacts 254 and to provide support to the substrate 45 and the mounting ground contacts 254. The ground trace engaging members 282 extend from the support members 283 and are mechanically and electrically mounted and connected to the ends of the ground traces 56 by known methods, such as, but not limited to, by pressure applied by the compliant beam of the ground trace engaging member 282 or by soldering. The compliant portions 287 are configured to engage the daughtercard (not shown). The compliant portions 287 may be, but are not limited to, an eye of the needle pin, although other configurations may be used.

While the invention has been described with reference to a preferred embodiment, it will be understood by those skilled in the art that various changes may be made and equivalents may be substituted for elements thereof without departing from the spirit and scope of the invention as defined in the accompanying claims. One skilled in the art will appreciate that the invention may be used with many modifications of structure, arrangement, proportions, sizes, materials and components and otherwise used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

The invention claimed is:

1. A circuit board for use in a modular electrical connector, the circuit board comprising:
   a first surface and an oppositely facing second surface;
   signal pathways provided on the first surface, the signal pathways having signal pathway ends abutting a mounting end of the circuit board;
   signal contacts extending from the signal pathway ends, the signal contacts having signal contact mounting members which are configured to mechanically and electrically engage the signal pathway ends;
   first ground pathways provided on the first surface, each of the first ground pathways positioned adjacent at least one of the signal pathways, the first ground pathways having first ground pathway ends abutting the mounting end of the circuit board;
   ground contacts extending from the first ground pathway ends, the ground contacts having ground contact mounting members which are configured to mechanically and electrically engage the first ground pathway ends;
   one or more second ground pathways provided on the second surface, the one or more second ground pathways having second ground pathway ends abutting the mounting end of the circuit board;

wherein the positioning of the signal pathway ends abutting the mounting end, the positioning of the first ground pathway ends abutting the mounting end and the positioning of the second ground pathway ends abutting the mounting end reduces the length of the signal contacts and the ground contacts and reduces crosstalk between signal pairs.

2. The circuit board as recited in claim 1, wherein the signal pathways have mating signal contact pads, signal traces and mounting signal contacts, the signal traces extend from proximate a mating end of the circuit board to abutting the mounting end of the circuit board.

3. The circuit board as recited in claim 2, wherein the signal pathways are arranged in pairs carrying differential signals.

4. The circuit board as recited in claim 3, wherein the first ground pathways have first mating ground contact pads, first ground traces and first mounting ground contacts, the first ground traces extend from proximate the mating end to abutting the mounting end of the circuit board.

5. The circuit board as recited in claim 4, wherein the second ground pathways have second ground traces, the second ground traces extend from proximate the mating end to abutting the mounting end of the circuit board.

6. The circuit board as recited in claim 5, wherein first openings are provided proximate the mounting end of the circuit board, the first openings are positioned in the signal traces and extend from the first surface to the second surface, the first openings are provided in electrical engagement with the signal traces.

7. The circuit board as recited in claim 6, wherein second openings are provided proximate the mounting end of the circuit board, the second openings are positioned in the first ground traces and the second ground traces and extend from the first surface to the second surface, the second openings are provided in electrical engagement with the first ground traces and the second ground traces.

8. The circuit board as recited in claim 7, wherein the mounting signal contacts have mounting members and compliant portions, the mounting members are positioned in the first openings through the first surfaces of the circuit board.

9. The circuit board as recited in claim 8, wherein the mounting ground contacts have mounting members and compliant portions, the mounting members are positioned in the second openings through the first surfaces of the circuit board.

10. The circuit board as recited in claim 5, wherein the mounting signal contacts and the mounting ground contacts have mounting members and compliant portions, the mounting members have trace engaging members and support members, the support members extend at approximately right angles to the trace engaging members.

11. The circuit board as recited in claim 10, wherein the support members have support surfaces which cooperate with the mounting end of the circuit board to properly locate the mounting signal contacts and to provide support to the circuit board and the mounting signal contacts.

12. The circuit board as recited in claim 10, wherein the trace engaging members extend from the support members.

\* \* \* \* \*